US 011885646 B2

(12) United States Patent
Myers et al.

(10) Patent No.: US 11,885,646 B2
(45) Date of Patent: Jan. 30, 2024

(54) PROGRAMMABLE ACTIVE PIXEL TEST INJECTION

(71) Applicant: Allegro MicroSystems, LLC, Manchester, NH (US)

(72) Inventors: Charles Myers, Portland, OR (US); Shunming Sun, Colorado Springs, CO (US); Adam Lee, Portland, OR (US)

(73) Assignee: Allegro MicroSystems, LLC, Manchester, NH (US)

( * ) Notice: Subject to any disclaimer, the term of this patent is extended or adjusted under 35 U.S.C. 154(b) by 29 days.

(21) Appl. No.: 17/400,300

(22) Filed: Aug. 12, 2021

(65) Prior Publication Data

US 2023/0051974 A1    Feb. 16, 2023

(51) Int. Cl.
G01D 18/00 (2006.01)
H01L 27/146 (2006.01)

(52) U.S. Cl.
CPC ....... *G01D 18/00* (2013.01); *H01L 27/14609* (2013.01)

(58) Field of Classification Search
None
See application file for complete search history.

(56) References Cited

U.S. PATENT DOCUMENTS

| 5,917,320 | A  | 6/1999  | Scheller et al. |
| 6,091,239 | A  | 7/2000  | Vig et al. |
| 6,297,627 | B1 | 10/2001 | Towne et al. |
| 6,693,419 | B2 | 2/2004  | Stauth et al. |
| 6,760,145 | B1 | 7/2004  | Taylor et al. |
| 6,778,728 | B2 | 8/2004  | Taylor et al. |
| 6,894,823 | B2 | 5/2005  | Taylor et al. |
| 6,989,921 | B2 | 1/2006  | Bernstein et al. |
| 7,015,780 | B2 | 3/2006  | Bernstein et al. |
| 7,160,753 | B2 | 1/2007  | Williams, Jr. |
| 7,253,614 | B2 | 8/2007  | Forrest et al. |
| 7,321,649 | B2 | 1/2008  | Lee |
| 7,432,537 | B1 | 10/2008 | Huntington |
| 7,504,053 | B1 | 3/2009  | Alekel |
| 7,605,623 | B2 | 10/2009 | Yun et al. |
| 7,724,050 | B2 | 5/2010  | Lee |
| 7,764,719 | B2 | 7/2010  | Munroe et al. |
| 7,782,911 | B2 | 8/2010  | Munroe et al. |

(Continued)

FOREIGN PATENT DOCUMENTS

TW    201422772    6/2014

OTHER PUBLICATIONS

U.S. Appl. No. 17/645,118, filed Dec. 20, 2021, Babushkin, et al.

(Continued)

*Primary Examiner* — Michael J Dalbo
*Assistant Examiner* — Denise R Karavias
(74) *Attorney, Agent, or Firm* — DALY, CROWLEY, MOFFORD & DURKEE, LLP

(57) ABSTRACT

Methods and apparatus for a detector system having a photodetector and an amplifier to amplify the photodetector signal. A discriminator generates an active output signal when the output from the amplifier is greater than a threshold. An injection circuit is coupled to the input of the amplifier. The injection circuit is configured to selectively inject a test pulse that mimics a pulse from the photodetector for verifying operation of the detector system.

10 Claims, 6 Drawing Sheets

(56) References Cited

U.S. PATENT DOCUMENTS

| | | |
|---|---|---|
| 7,787,262 B2 | 8/2010 | Mangtani et al. |
| 7,852,549 B2 | 12/2010 | Alekel et al. |
| 7,885,298 B2 | 2/2011 | Munroe |
| 7,990,194 B2 | 8/2011 | Shim |
| 7,994,421 B2 | 8/2011 | Williams et al. |
| 8,207,484 B1 | 6/2012 | Williams |
| 8,319,307 B1 | 11/2012 | Williams |
| 8,570,372 B2 | 10/2013 | Russell |
| 8,597,544 B2 | 12/2013 | Alekel |
| 8,630,036 B2 | 1/2014 | Munroe |
| 8,630,320 B2 | 1/2014 | Munroe et al. |
| 8,729,890 B2 | 5/2014 | Donovan et al. |
| 8,730,564 B2 | 5/2014 | Alekel |
| 8,743,453 B2 | 6/2014 | Alekel et al. |
| 8,760,499 B2 | 6/2014 | Russell |
| 8,766,682 B2 | 7/2014 | Williams |
| 8,853,639 B2 | 10/2014 | Williams, Jr. |
| 8,917,128 B1 | 12/2014 | Baek et al. |
| 9,121,762 B2 | 9/2015 | Williams et al. |
| 9,164,826 B2 | 10/2015 | Fernandez |
| 9,197,233 B2 | 11/2015 | Gaalema et al. |
| 9,269,845 B2 | 2/2016 | Williams et al. |
| 9,329,057 B2 | 5/2016 | Foletto et al. |
| 9,368,933 B1 | 6/2016 | Nijjar et al. |
| 9,397,469 B1 | 7/2016 | Nijjar et al. |
| 9,447,299 B2 | 9/2016 | Schut et al. |
| 9,451,554 B1 | 9/2016 | Singh et al. |
| 9,466,745 B2 | 10/2016 | Williams et al. |
| 9,520,871 B2 | 12/2016 | Eagen et al. |
| 9,553,216 B2 | 1/2017 | Williams et al. |
| 9,591,238 B2 | 3/2017 | Lee et al. |
| 9,621,041 B2 | 4/2017 | Sun et al. |
| 9,693,035 B2 | 6/2017 | Williams et al. |
| 9,759,602 B2 | 9/2017 | Williams |
| 9,804,264 B2 | 10/2017 | Villeneuve et al. |
| 9,810,775 B1 | 11/2017 | Welford et al. |
| 9,810,777 B2 | 11/2017 | Williams et al. |
| 9,810,786 B1 | 11/2017 | Welford et al. |
| 9,812,838 B2 | 11/2017 | Villeneuve et al. |
| 9,823,353 B2 | 11/2017 | Eichenholz et al. |
| 9,835,490 B2 | 12/2017 | Williams et al. |
| 9,841,495 B2 | 12/2017 | Campbell et al. |
| 9,843,157 B2 | 12/2017 | Williams |
| 9,847,441 B2 | 12/2017 | Huntington |
| 9,857,468 B1 | 1/2018 | Eichenholz et al. |
| 9,869,754 B1 | 1/2018 | Campbell et al. |
| 9,874,635 B1 | 1/2018 | Eichenholz et al. |
| 9,897,687 B1 | 2/2018 | Campbell et al. |
| 9,905,992 B1 | 2/2018 | Welford et al. |
| 9,910,088 B2 | 3/2018 | Milano et al. |
| 9,923,331 B2 | 3/2018 | Williams |
| 9,941,433 B2 | 4/2018 | Williams et al. |
| 9,958,545 B2 | 5/2018 | Eichenholz et al. |
| 9,989,629 B1 | 6/2018 | LaChapelle |
| 9,995,622 B2 | 6/2018 | Williams |
| 10,003,168 B1 | 6/2018 | Villeneuve |
| 10,007,001 B1 | 6/2018 | LaChapelle et al. |
| 10,012,732 B2 | 7/2018 | Eichenholz et al. |
| 10,056,909 B1 | 8/2018 | Qi et al. |
| 10,061,019 B1 | 8/2018 | Campbell et al. |
| 10,073,136 B2 | 9/2018 | Milano et al. |
| 10,088,559 B1 | 10/2018 | Weed et al. |
| 10,094,925 B1 | 10/2018 | LaChapelle |
| 10,110,128 B2 | 10/2018 | Raval et al. |
| 10,114,111 B2 | 10/2018 | Russell et al. |
| 10,121,813 B2 | 11/2018 | Eichenholz et al. |
| 10,139,478 B2 | 11/2018 | Gaalema et al. |
| 10,156,461 B2 | 12/2018 | Snyder et al. |
| 10,169,678 B1 | 1/2019 | Sachdeva et al. |
| 10,169,680 B1 | 1/2019 | Sachdeva et al. |
| 10,175,345 B2 | 1/2019 | Rhee et al. |
| 10,175,697 B1 | 1/2019 | Sachdeva et al. |
| 10,191,155 B2 | 1/2019 | Curatu |
| 10,209,359 B2 | 2/2019 | Russell et al. |
| 10,211,592 B1 | 2/2019 | Villeneuve et al. |
| 10,211,593 B1 | 2/2019 | Lingvay et al. |
| 10,217,889 B2 | 2/2019 | Dhulla et al. |
| 10,218,144 B2 | 2/2019 | Munroe et al. |
| 10,241,198 B2 | 3/2019 | LaChapelle et al. |
| 10,254,388 B2 | 4/2019 | LaChapelle et al. |
| 10,254,762 B2 | 4/2019 | McWhirter et al. |
| 10,267,898 B2 | 4/2019 | Campbell et al. |
| 10,267,899 B2 | 4/2019 | Weed et al. |
| 10,267,918 B2 | 4/2019 | LaChapelle et al. |
| 10,275,689 B1 | 4/2019 | Sachdeva et al. |
| 10,291,125 B2 | 5/2019 | Raval et al. |
| 10,295,668 B2 | 5/2019 | LaChapelle et al. |
| 10,310,058 B1 | 6/2019 | Campbell et al. |
| 10,324,170 B1 | 6/2019 | Engberg, Jr. et al. |
| 10,324,185 B2 | 6/2019 | McWhirter et al. |
| 10,338,199 B1 | 7/2019 | McWhirter et al. |
| 10,338,223 B1 | 7/2019 | England et al. |
| 10,340,651 B1 | 7/2019 | Drummer et al. |
| 10,345,437 B1 | 7/2019 | Russell et al. |
| 10,345,447 B1 | 7/2019 | Hicks |
| 10,348,051 B1 | 7/2019 | Shah et al. |
| 10,386,489 B2 | 8/2019 | Albelo et al. |
| 10,394,243 B1 | 8/2019 | Ramezani et al. |
| 10,401,480 B1 | 9/2019 | Gaalema et al. |
| 10,401,481 B2 | 9/2019 | Campbell et al. |
| 10,418,776 B2 | 9/2019 | Welford et al. |
| 10,445,599 B1 | 10/2019 | Hicks |
| 10,451,716 B2 | 10/2019 | Hughes et al. |
| 10,473,788 B2 | 11/2019 | England et al. |
| 10,481,181 B2 | 11/2019 | Bussing et al. |
| 10,481,605 B1 | 11/2019 | Maila et al. |
| 10,488,458 B2 | 11/2019 | Milano et al. |
| 10,488,496 B2 | 11/2019 | Campbell et al. |
| 10,491,885 B1 | 11/2019 | Hicks |
| 10,498,384 B2 | 12/2019 | Briano |
| 10,502,831 B2 | 12/2019 | Eichenholz |
| 10,503,172 B2 | 12/2019 | England et al. |
| 10,509,127 B2 | 12/2019 | England et al. |
| 10,514,462 B2 | 12/2019 | England et al. |
| 10,520,602 B2 | 12/2019 | Villeneuve et al. |
| 10,523,884 B2 * | 12/2019 | Lee ........................ H04N 5/378 |
| 10,535,191 B2 | 1/2020 | Sachdeva et al. |
| 10,539,665 B1 | 1/2020 | Danziger et al. |
| 10,545,240 B2 | 1/2020 | Campbell et al. |
| 10,551,485 B1 | 2/2020 | Maheshwari et al. |
| 10,551,501 B1 | 2/2020 | LaChapelle |
| 10,557,939 B2 | 2/2020 | Campbell et al. |
| 10,557,940 B2 | 2/2020 | Eichenholz et al. |
| 10,571,567 B2 | 2/2020 | Campbell et al. |
| 10,571,570 B1 | 2/2020 | Paulsen et al. |
| 10,578,720 B2 | 3/2020 | Hughes et al. |
| 10,591,600 B2 | 3/2020 | Villeneuve et al. |
| 10,591,601 B2 | 3/2020 | Hicks et al. |
| 10,606,270 B2 | 3/2020 | England et al. |
| 10,613,158 B2 | 4/2020 | Cook et al. |
| 10,627,495 B2 | 4/2020 | Gaalema et al. |
| 10,627,512 B1 | 4/2020 | Hicks |
| 10,627,516 B2 | 4/2020 | Eichenholz |
| 10,627,521 B2 | 4/2020 | England et al. |
| 10,634,735 B2 | 4/2020 | Kravljaca et al. |
| 10,636,285 B2 | 4/2020 | Haas et al. |
| 10,641,874 B2 | 5/2020 | Campbell et al. |
| 10,663,564 B2 | 5/2020 | LaChapelle |
| 10,663,585 B2 | 5/2020 | McWhirter |
| 10,677,897 B2 | 6/2020 | LaChapelle et al. |
| 10,677,900 B2 | 6/2020 | Russell et al. |
| 10,684,360 B2 | 6/2020 | Campbell |
| 10,908,190 B2 | 2/2021 | Bussing et al. |
| 10,948,537 B2 | 3/2021 | Forrest et al. |
| 11,029,176 B2 | 6/2021 | Geiger et al. |
| 11,115,244 B2 | 9/2021 | Briano et al. |
| 11,177,814 B2 | 11/2021 | Kim et al. |
| 11,313,899 B2 | 4/2022 | Milano et al. |
| 11,409,000 B1 | 8/2022 | Behzadi et al. |
| 11,451,234 B1 | 9/2022 | Austin et al. |
| 2003/0112913 A1 | 6/2003 | Balasubramanian |
| 2004/0169753 A1 * | 9/2004 | Gulbransen ........ H04N 5/37452 |
| | | 348/E3.019 |

(56) References Cited

U.S. PATENT DOCUMENTS

| | | | |
|---|---|---|---|
| 2007/0257193 A1* | 11/2007 | Macciocchi | G01T 7/005 |
| | | | 250/341.5 |
| 2011/0270543 A1* | 11/2011 | Schmidt | G01R 31/2635 |
| | | | 702/58 |
| 2013/0169329 A1 | 7/2013 | Searles | |
| 2013/0176061 A1 | 7/2013 | Haerle et al. | |
| 2014/0094993 A1* | 4/2014 | Johnson | H04N 17/002 |
| | | | 701/1 |
| 2016/0013796 A1 | 1/2016 | Choi | |
| 2016/0054434 A1* | 2/2016 | Williams | G01S 17/894 |
| | | | 356/5.01 |
| 2017/0250694 A1 | 8/2017 | Im et al. | |
| 2018/0054206 A1 | 2/2018 | Im et al. | |
| 2018/0068699 A1 | 3/2018 | Choi et al. | |
| 2018/0069367 A1 | 3/2018 | Villeneuve et al. | |
| 2018/0191356 A1 | 7/2018 | Kesarwani | |
| 2018/0191979 A1* | 7/2018 | Mu | H04N 5/3651 |
| 2018/0284239 A1 | 10/2018 | LaChapelle et al. | |
| 2018/0284240 A1 | 10/2018 | LaChapelle et al. | |
| 2018/0284275 A1 | 10/2018 | LaChapelle | |
| 2018/0284280 A1 | 10/2018 | Eichenholz et al. | |
| 2019/0033460 A1 | 1/2019 | Lipson | |
| 2019/0310368 A1 | 10/2019 | LaChapelle | |
| 2021/0124050 A1 | 4/2021 | Puglia et al. | |
| 2021/0132229 A1* | 5/2021 | Milkov | G01S 17/14 |
| 2022/0236376 A1 | 7/2022 | Li et al. | |
| 2022/0294172 A1* | 9/2022 | Taylor | H01S 5/06812 |

OTHER PUBLICATIONS

U.S. Appl. No. 17/657,140, filed Mar. 20, 2022, Myers.
U.S. Appl. No. 17/659,033, filed Apr. 13, 2022, Cadugan et al.
U.S. Appl. No. 17/659,035, filed Apr. 13, 2022, Cadugan et al.
U.S. Appl. No. 17/660,221, filed Apr. 22, 2022, Filippini et al.
U.S. Appl. No. 17/663,896, filed May 18, 2022, Cadugan et al.
U.S. Appl. No. 17/805,070, filed Jun. 2, 2022, Myers et al.
U.S. Appl. No. 17/809,990, filed Jun. 30, 2022, Quirk et al.
U.S. Notice of Allowance dated Oct. 24, 2022 for U.S. Appl. No. 17/660,221; 9 pages.
U.S. Appl. No. 17/566,763, filed Dec. 31, 2021, Huntington et al.
U.S. Appl. No. 17/648,702, filed Jan. 24, 2022, Lee et al.
U.S. Appl. No. 17/651,250, filed Feb. 16, 2022, Marshall.
U.S. Appl. No. 17/653,881, filed Mar. 8, 2022, Keuleyan et al.
U.S. Appl. No. 17/656,977, filed Mar. 29, 2022, Myers et al.
U.S. Appl. No. 17/656,978, filed Mar. 29, 2022, Myers et al.
U.S. Appl. No. 17/656,981, filed Mar. 29, 2022, Myers et al.
U.S. Appl. No. 17/197,314, filed Mar. 10, 2021, Taylor et al.
U.S. Appl. No. 17/197,328, filed Mar. 30, 2021, Taylor et al.
U.S. Appl. No. 17/230,253, filed Apr. 14, 2021, Judkins, III et al.
U.S. Appl. No. 17/230,276, filed Apr. 14, 2021, Cadugan.
U.S. Appl. No. 17/230,277, filed Apr. 14, 2021, Judkins, III et al.
U.S. Appl. No. 17/352,829, filed Jun. 21, 2021, Huntington et al.
U.S. Appl. No. 17/352,937, filed Jun. 21, 2021, Cadugan et al.
U.S. Appl. No. 17/376,607, filed Jul. 15, 2021, Stewart et al.
U.S. Appl. No. 17/402,065, filed Aug. 13, 2021, Lee et al.
U.S. Notice of Allowance dated Jan. 25, 2023 for U.S. Appl. No. 17/660,221; 7 pages.

* cited by examiner

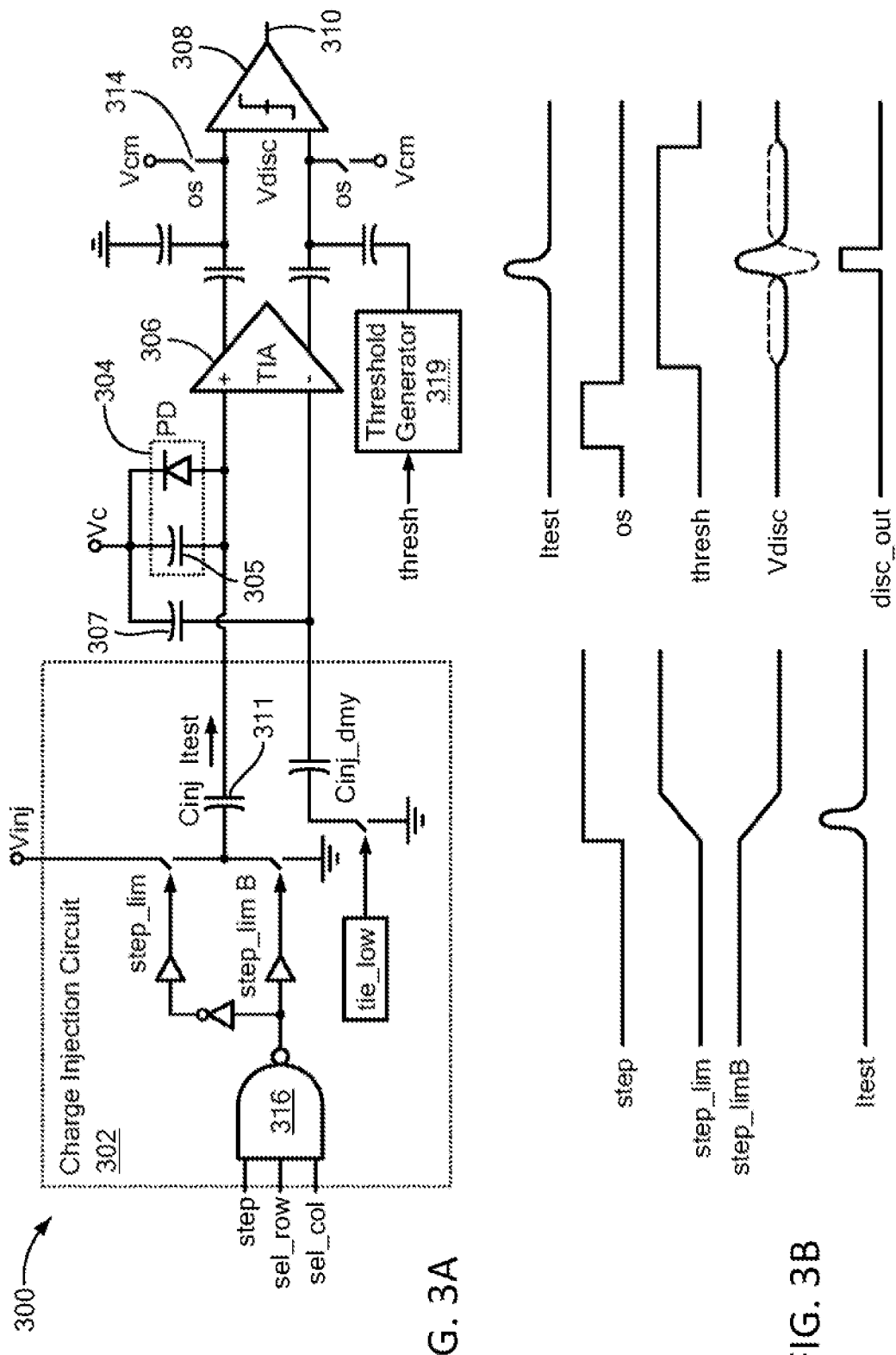

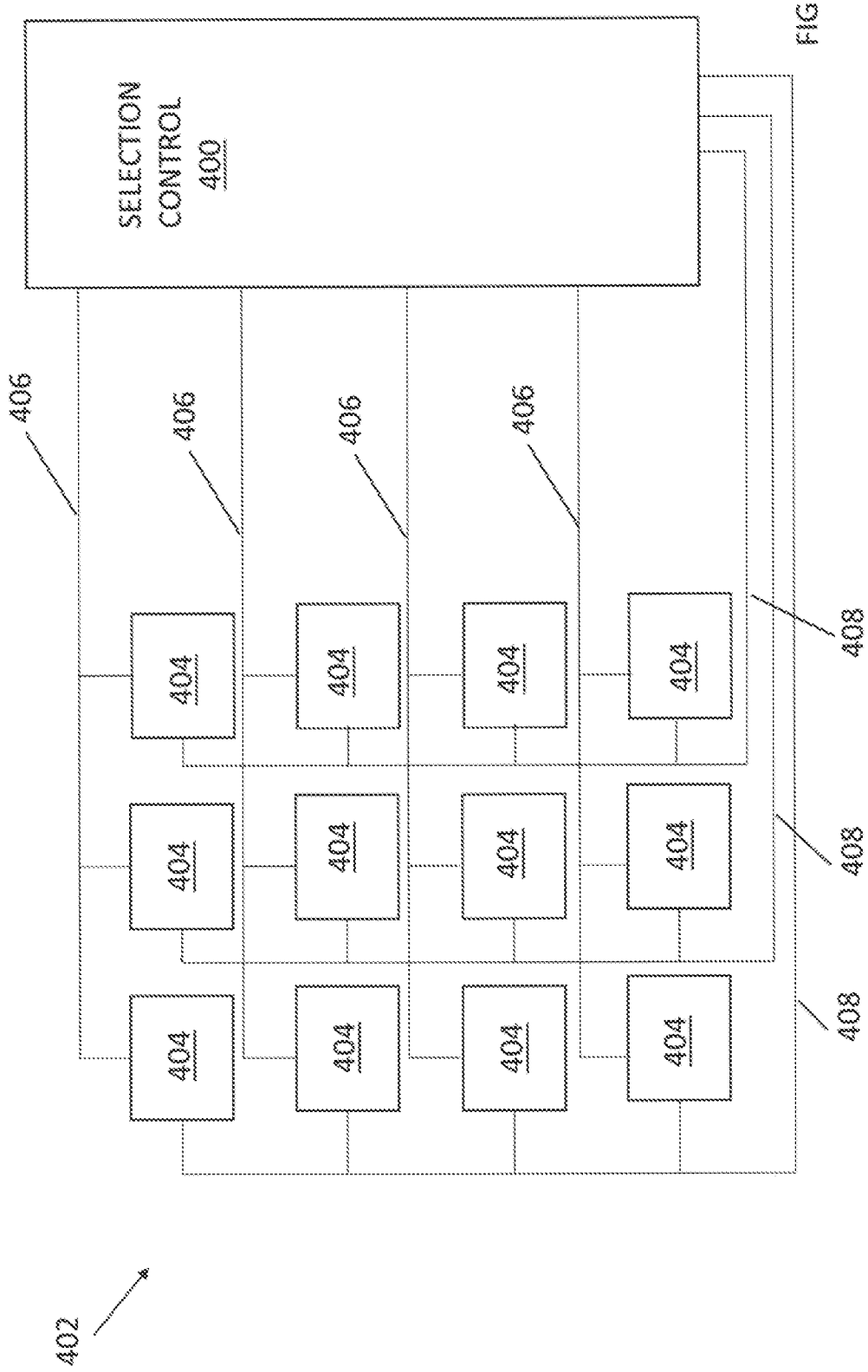

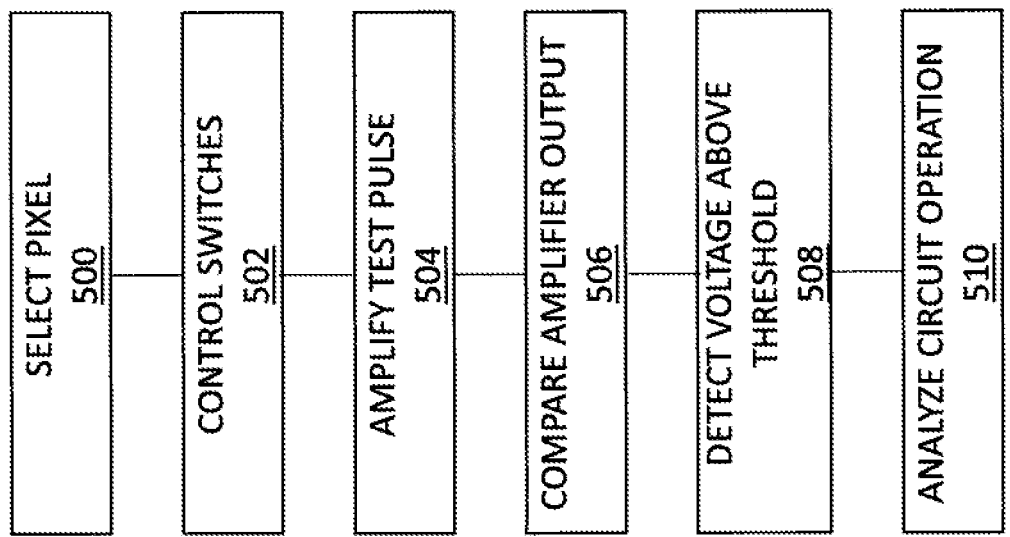

PROGRAMMABLE ACTIVE PIXEL TEST INJECTION

BACKGROUND

As is known in the art, pixel circuits used in photonic detection systems look for active transient signals indicating optical returns from pulse-illuminated scenes of interest. The pulsed illumination propagates from the optical source, reflects off objects in the active imaging system field of view, and returns towards the active imaging system. Pixels in the active imaging convert this input energy, generally photo-current from a photo-detector device, into a voltage signal that is compared to a threshold for detecting the presence and timing of an active optical return. The timing information from this active system is used to calculate range to an object in the field of view of the active imaging system.

SUMMARY

Embodiments of the disclosure provide a photodetection system having a programmable pixel test injection circuit. In example embodiments, a system can include a photo-detector, an amplifier, a differential voltage discriminator, a charge injection circuit, and a selection control circuit. The photo-detector converts incident photon energy striking the photo-detector into current flow that is proportional to the number of photons striking the photo-detector. A common photo-detector device is a photo-diode which creates reverse-bias current flow proportional to photons of particular wavelengths striking the device and has an intrinsic capacitance between anode and cathode nodes. In embodiments, the amplifier comprises a transimpedance amplifier that converts photo-current into a corresponding voltage output. In some embodiments, the circuit is implemented as a single-ended circuit with implicit reference to ground or another reference voltage.

In other embodiments, the circuit is implemented as a differential circuit which converts the photo-current into a differential output voltage. The output is coupled to the input of the differential voltage discriminator either though AC coupling capacitors, for example, or with a direct connection to the input. In embodiments, the differential voltage discriminator detects when the positive input exceeds the negative input and produces a digital output pulse corresponding to time a duration of the positive input exceedance. In single-ended pixel systems, the threshold may be directly applied to the negative input of the differential voltage discriminator. In differential pixel systems, the threshold is injected into the differential signal path.

In embodiments, the charge injection circuit is constructed from an injection capacitor, switches, and rate-limited switch drivers and control logic. The switches serve to transition the voltage on the injection capacitor from ground to a reference voltage injecting charge proportional to the change in voltage and the injection capacitor size. The charge injection circuit may provide a moment of charge transfer onto the photo-detector node which is equivalent to a current pulse. This current pulse may mimic an active photo-current return pulse from the photo-detector and allow testing the active imaging functions of the pixel.

The injection capacitor may be kept small to limit the performance impact on the active pixel circuit. In one embodiment, the injection capacitor comprises a parasitic metal-metal capacitor. Other embodiments may use capacitor devices and be limited to a minimum capacitance according to device minimum sizes. Other embodiments may be constructed using devices or materials having capacitive properties between two conductive nodes.

In embodiments, the reference voltages used for switching the voltage on the injection capacitor may comprise any practical voltage. One embodiment uses ground for one reference and a programmable reference voltage for the other reference. The programmable reference voltage allows a variable charge injection which mimics various return energies and allows the test feature to evaluate the sensitivity of each pixel in-situ.

In example embodiments, the rate-limited switch drivers control the rate of the of the charge injection, and thus, the width of the current injection pulse. It may be desirable to test the active pixel with a current injection pulse similar to the width of the optical pulses used in the active imaging system. One embodiment includes controllable rate-limited switch drivers to allow for programmable switch transition rates, and therefore, programmable current injection pulse widths. Another embodiment drives the switches with logic devices allowing the injection current pulse width to be limited by the logic drive speed and switch on-resistance.

The control logic may comprise a logical decoder to allow for control of the pixel injection in a number of different ways. One embodiment uses row and column select controls to enable a system allowing individual pixels to be selected active for the test current injection. This arrangement also allows multiple pixels on a row or multiple pixels on a column to be selected, as well as all pixels on a row, all pixels on a column, multiple rows or columns of pixels, or all pixels to be globally selected. Another embodiment comprises a 1-dimensional pixel array with a single pixel-select input to enable the pixel and allow single pixel, multiple pixel, or all pixel selection as desired. Another embodiment may remove selection options entirely to enable driving all pixels with the test signal at the same time. Selection functions may be implemented external to the pixel and the step signal delivered to the pixel may be filtered before delivery to the pixel.

In embodiments, photodetector systems are configured for automotive or other safety-sensitive applications and meet safety standards, such as ISO 26262 which includes specification of an Application Safety Integration Level (ASIL). In order to meet the high fault detectability standards required, validation of the active operation of all pixels in the active imaging system may be required. The active testing of pixels may enable safety reporting to detect and report on unsafe active imager status which may develop over the lifetime or may be related to other system failures.

In one aspect, a detector system comprises: a photodetector; an amplifier having an input to receive an output from the photodetector; a discriminator to receive an output from the amplifier and generate an active output signal when the output from the amplifier is greater than a threshold; and an injection circuit coupled to the input of the amplifier, wherein the injection circuit is configured to selectively inject a test pulse that mimics a pulse from the photodetector for verifying operation of the detector system.

A detector system can further include one or more of the following features: the injection circuit comprises an injection capacitor coupled to the input of the amplifier, the amplifier comprises a transimpedance amplifier, the discriminator comprises a voltage discriminator, the injection circuit includes first and second switches and an injection capacitor having a terminal coupled between the first and second switches, the first and second switches transition a voltage on the injection capacitor from a first reference voltage to a second reference voltage injecting charge proportional to a change in voltage and size of the injection capacitor, a selection control circuit coupled to the injection circuit to control generation of the test pulse and state of the first and second switches, the selection control circuit controls the first and second switches with rate-limited signals to control a width of the injection pulse, the selection control circuit controls generation of the injection pulse based on row and column of the photodetector within an array, the amplifier and the discriminator receive differential signals so that that discriminator detects when a positive input to the discriminator exceeds a negative input to the discriminator, a safety module to detect a fault by monitoring an output of the discriminator, and/or the safety module is configured to generate an alert after detection of the fault.

In another aspect, a method comprises: amplifying, with an amplifier, an input from an output from a photodetector; generating, by a discriminator, an active output signal when the output from the amplifier is greater than a threshold; and selectively injecting, by an injection circuit, a test pulse that mimics a pulse from the photodetector for verifying operation of the detector system.

A method can further include one or more of the following features: the injection circuit comprises an injection capacitor coupled to the input of the amplifier, the amplifier comprises a transimpedance amplifier, the discriminator comprises a voltage discriminator, the injection circuit includes first and second switches and an injection capacitor having a terminal coupled between the first and second switches, the first and second switches transition a voltage on the injection capacitor from a first reference voltage to a second reference voltage injecting charge proportional to a change in voltage and size of the injection capacitor, a selection control circuit coupled to the injection circuit to control generation of the test pulse and state of the first and second switches, the selection control circuit controls the first and second switches with rate-limited signals to control a width of the injection pulse, the selection control circuit controls generation of the injection pulse based on row and column of the photodetector within an array, the amplifier and the discriminator receive differential signals so that that discriminator detects when a positive input to the discriminator exceeds a negative input to the discriminator, a safety module to detect a fault by monitoring an output of the discriminator, and/or the safety module is configured to generate an alert after detection of the fault.

In a further aspect, a detector system comprises: a means for detecting photons; an amplifier having an input to receive an output from the means for detecting photons; a discriminator means for receiving an output from the amplifier and generating an active output signal when the output from the amplifier is greater than a threshold; and an injection circuit means for selectively injecting a test pulse that mimics a pulse from the photodetector for verifying operation of the detector system.

BRIEF DESCRIPTION OF THE DRAWINGS

The foregoing features of this disclosure, as well as the disclosure itself, may be more fully understood from the following description of the drawings in which:

FIG. 3A is a diagram of an example differential circuit implementation of the system of FIG. 1;

FIG. 3B is a waveform diagram for signals in the circuit of FIG. 3A;

FIG. 4 is a schematic representation of an example pixel selection circuit;

FIG. 5 is a flow diagram of an example sequence of steps for providing a photo-detector system having pixel test injection functionality.

DETAILED DESCRIPTION

Figure 1:
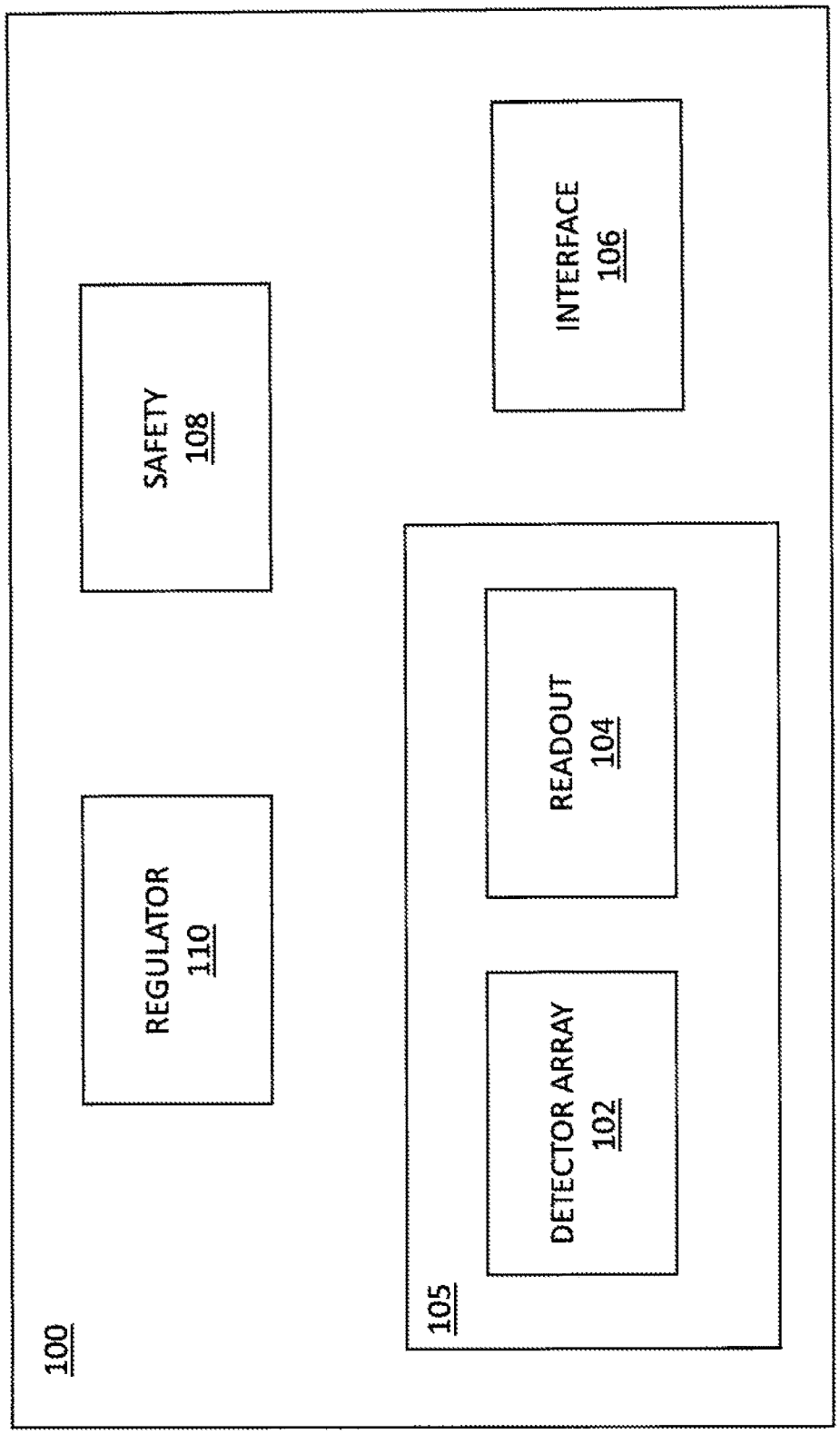
FIG. 1 is a block diagram of an example photo-detector system having pixel test injection functionality in accordance with illustrative embodiments of the disclosure.

Prior to describing example embodiments of the disclosure some information is provided. Laser ranging systems can include laser radar (ladar), light-detection and ranging (lidar), and rangefinding systems, which are generic terms for the same class of instrument that uses light to measure the distance to objects in a scene. This concept is similar to radar, except optical signals are used instead of radio waves. Similar to radar, a laser ranging and imaging system emits an optical signal, e.g. a pulse or continuous optical signal, toward a particular location and measures return reflections to extract range information.

Laser ranging systems generally work by emitting a laser pulse and recording the time it takes for the laser pulse to travel to a target, reflect, and return to a photoreceiver. The laser ranging instrument records the time of the outgoing pulse—either from a trigger or from calculations that use measurements of the scatter from the outgoing laser light—and then records the time that a laser pulse returns. The difference between these two times is the time of flight to and from the target. Using the speed of light, the round-trip time of the pulses is used to calculate the distance to the target.

Lidar systems may scan the beam across a target area to measure the distance to multiple points across the field of view, producing a full three-dimensional range profile of the surroundings. More advanced flash lidar cameras, for example, contain an array of detector elements, each able to record the time of flight to objects in their field of view.

When using light pulses to create images, the emitted pulse may intercept multiple objects, at different orientations, as the pulse traverses a 3D volume of space. The reflected laser-pulse waveform contains a temporal and amplitude imprint of the scene. By sampling the light reflections, a record of the interactions of the emitted pulse is extracted with the intercepted objects of the scene, allowing an accurate multi-dimensional image to be created. To simplify signal processing and reduce data storage, laser ranging and imaging can be dedicated to discrete-return systems, which record only the time of flight (TOF) of the first, or a few, individual target returns to obtain angle-angle-range images. In a discrete-return system, each recorded return corresponds, in principle, to an individual laser reflection (i.e., a reflection from one particular reflecting surface, for example, a vehicle, a person, a tree, pole or building). By recording just a few individual ranges, discrete-return systems simplify signal processing and reduce data storage, but they do so at the expense of lost target and scene reflectivity data. Because laser-pulse energy has significant associated costs and drives system size and weight, recording the TOF and pulse amplitude of more than one laser pulse return per transmitted pulse, to obtain angle-angle-range-intensity images, increases the amount of captured information per unit of pulse energy. All other things equal, capturing the full pulse return waveform offers significant advantages, such that the maximum data is extracted from the investment in average laser power. In full-waveform systems, each backscattered laser pulse received by the system is digitized at a high sampling rate (e.g., 500 MHz to 1.5 GHz). This process generates digitized waveforms (amplitude versus time) that may be processed to achieve higher-fidelity 3D images.

Of the various laser ranging instruments available, those with single-element photoreceivers generally obtain range data along a single range vector, at a fixed pointing angle. This type of instrument—which is, for example, commonly used by golfers and hunters—either obtains the range (R) to one or more targets along a single pointing angle or obtains the range and reflected pulse intensity (I) of one or more objects along a single pointing angle, resulting in the collection of pulse range-intensity data, $(R,I)_i$, where i indicates the number of pulse returns captured for each outgoing laser pulse.

More generally, laser ranging instruments can collect ranging data over a portion of the solid angles of a sphere, defined by two angular coordinates (e.g., azimuth and elevation), which can be calibrated to three-dimensional (3D) rectilinear cartesian coordinate grids; these systems are generally referred to as 3D lidar and ladar instruments. The terms "lidar" and "ladar" are often used synonymously and, for the purposes of this discussion, the terms "3D lidar," "scanned lidar," or "lidar" are used to refer to these systems without loss of generality. 3D lidar instruments obtain three-dimensional (e.g., angle, angle, range) data sets. Conceptually, this would be equivalent to using a rangefinder and scanning it across a scene, capturing the range of objects in the scene to create a multi-dimensional image. When only the range is captured from the return laser pulses, these instruments obtain a 3D data set (e.g., angle, angle, range)$_n$, where the index n is used to reflect that a series of range-resolved laser pulse returns can be collected, not just the first reflection.

Some 3D lidar instruments are also capable of collecting the intensity of the reflected pulse returns generated by the objects located at the resolved (angle, angle, range) objects in the scene. When both the range and intensity are recorded, a multi-dimensional data set [e.g., angle, angle, (range-intensity)$_n$] is obtained. This is analogous to a video camera in which, for each instantaneous field of view (FOV), each effective camera pixel captures both the color and intensity of the scene observed through the lens. However, 3D lidar systems, instead capture the range to the object and the reflected pulse intensity.

Lidar systems can include different types of lasers, including those operating at different wavelengths, including those that are not visible (e.g., those operating at a wavelength of 840 nm or 905 nm), and in the near-infrared (e.g., those operating at a wavelength of 1064 nm or 1550 nm), and the thermal infrared including those operating at wavelengths known as the "eyesafe" spectral region (i.e., generally those operating at a wavelength beyond about 1400-nm), where ocular damage is less likely to occur. Lidar transmitters are generally invisible to the human eye. However, when the wavelength of the laser is close to the range of sensitivity of the human eye—roughly 350 nm to 730 nm—the energy of the laser pulse and/or the average power of the laser must be lowered such that the laser operates at a wavelength to which the human eye is not sensitive. Thus, a laser operating at, for example, 1550 nm, can—without causing ocular damage—generally have 200 times to 1 million times more laser pulse energy than a laser operating at 840 nm or 905 nm.

One challenge for a lidar system is detecting poorly reflective objects at long distance, which requires transmitting a laser pulse with enough energy that the return signal—reflected from the distant target—is of sufficient magnitude to be detected. To determine the minimum required laser transmission power, several factors must be considered. For instance, the magnitude of the pulse returns scattering from the diffuse objects in a scene is proportional to their range and the intensity of the return pulses generally scales with distance according to $1/R^4$ for small objects and $1/R^2$ for larger objects; yet, for highly-specularly reflecting objects (i.e., those objects that are not diffusively-scattering objects), the collimated laser beams can be directly reflected back, largely unattenuated. This means that—if the laser pulse is transmitted, then reflected from a target 1 meter away—it is possible that the full energy (J) from the laser pulse will be reflected into the photoreceiver; but—if the laser pulse is transmitted, then reflected from a target 333 meters away—it is possible that the return will have a pulse with energy approximately $10^{12}$ weaker than the transmitted energy.

In many cases of lidar systems highly-sensitive photoreceivers are used to increase the system sensitivity to reduce the amount of laser pulse energy that is needed to reach poorly reflective targets at the longest distances required, and to maintain eyesafe operation. Some variants of these detectors include those that incorporate photodiodes, and/or offer gain, such as avalanche photodiodes (APDs) or single-photon avalanche detectors (SPADs). These variants can be configured as single-element detectors-segmented-detectors, linear detector arrays, or area detector arrays. Using highly sensitive detectors such as APDs or SPADs reduces the amount of laser pulse energy required for long-distance ranging to poorly reflective targets. The technological challenge of these photodetectors is that they must also be able to accommodate the incredibly large dynamic range of signal amplitudes.

As dictated by the properties of the optics, the focus of a laser return changes as a function of range; as a result, near objects are often out of focus. Furthermore, also as dictated by the properties of the optics, the location and size of the "blur"—i.e., the spatial extent of the optical signal—changes as a function of range, much like in a standard camera. These challenges are commonly addressed by using large detectors, segmented detectors, or multi-element detectors to capture all of the light or just a portion of the light over the full-distance range of objects. It is generally advisable to design the optics such that reflections from close objects are blurred, so that a portion of the optical energy does not reach the detector or is spread between multiple detectors. This design strategy reduces the dynamic range requirements of the detector and prevents the detector from damage.

Acquisition of the lidar imagery can include, for example, a 3D lidar system embedded in the front of car, where the 3D lidar system, includes a laser transmitter with any necessary optics, a single-element photoreceiver with any necessary dedicated or shared optics, and an optical scanner used to scan ("paint") the laser over the scene. Generating a full-frame 3D lidar range image—where the field of view is 20 degrees by 60 degrees and the angular resolution is 0.1 degrees (10 samples per degree)—requires emitting 120,000 pulses [(20*10*60*10)=120,000)]. When update rates of 30 frames per second are required, such as is required for automotive lidar, roughly 3.6 million pulses per second must be generated and their returns captured.

There are many ways to combine and configure the elements of the lidar system—including considerations for the laser pulse energy, beam divergence, detector array size and array format (single element, linear, 2D array), and scanner to obtain a 3D image. If higher power lasers are deployed, pixelated detector arrays can be used, in which case the divergence of the laser would be mapped to a wider field of view relative to that of the detector array, and the laser pulse energy would need to be increased to match the proportionally larger field of view. For example—compared to the 3D lidar above—to obtain same-resolution 3D lidar images 30 times per second, a 120,000-element detector array (e.g., 200×600 elements) could be used with a laser that has pulse energy that is 120,000 times greater. The advantage of this "flash lidar" system is that it does not require an optical scanner; the disadvantages are that the larger laser results in a larger, heavier system that consumes more power, and that it is possible that the required higher pulse energy of the laser will be capable of causing ocular damage. The maximum average laser power and maximum pulse energy are limited by the requirement for the system to be eyesafe.

As noted above, while many lidar system operate by recording only the laser time of flight and using that data to obtain the distance to the first target return (closest) target, some lidar systems are capable of capturing both the range and intensity of one or multiple target returns created from each laser pulse. For example, for a lidar system that is capable of recording multiple laser pulse returns, the system can detect and record the range and intensity of multiple returns from a single transmitted pulse. In such a multi-pulse lidar system, the range and intensity of a return pulse from a from a closer-by object can be recorded, as well as the range and intensity of later reflection(s) of that pulse—one(s) that moved past the closer-by object and later reflected off of more-distant object(s). Similarly, if glint from the sun reflecting from dust in the air or another laser pulse is detected and mistakenly recorded, a multi-pulse lidar system allows for the return from the actual targets in the field of view to still be obtained.

The amplitude of the pulse return is primarily dependent on the specular and diffuse reflectivity of the target, the size of the target, and the orientation of the target. Laser returns from close, highly-reflective objects, are many orders of magnitude greater in intensity than the intensity of returns from distant targets. Many lidar systems require highly sensitive photodetectors, for example avalanche photo-diodes (APDs), which along with their CMOS amplification circuits allow low reflectivity targets to be detected, provided the photoreceiver components are optimized for high conversion gain. Largely because of their high sensitivity, these detectors may be damaged by very intense laser pulse returns.

However, capturing the intensity of pulses over a larger dynamic range associated with laser ranging may be challenging because the signals are too large to capture directly. One can infer the intensity by using a recording of a bit-modulated output obtained using serial-bit encoding obtained from one or more voltage threshold levels. This technique is often referred to as time-over-threshold (TOT) recording or, when multiple-thresholds are used, multiple time-over-threshold (MTOT) recording.

FIG. 1 shows an example detector system 100 having safety functionality. The system 100 includes a photo-detector array 102 to convert incident photon energy striking the photo-detectors in the array into current flow that is proportional to the number of photons striking the photo-detectors. A common photo-detector device comprises a photo-diode which creates reverse-bias current flow proportional to photons of particular wavelengths striking the device and has intrinsic capacitance between the anode and cathode.

The detector array 102, which can comprise a sensor chip assembly (SCA) 105 having an array of pixels, is coupled to a readout module 104, such as a readout integrated circuit (ROIC). Although the SCA 105 is shown as a ROIC and detector array in another embodiment they may comprise one piece of material, for example a monolithic silicon detector. In addition, the READOUT module 106 may comprise a silicon circuit and the detector module 102 may comprise a different material, such as, but not limited to GaAs, InGaAs, InGaAsP, and/or other detector materials.

In embodiments, the detector array 102 can comprise a single pixel, or pixels in one dimension (1D), two dimensions (2D) An interface module 106 can output the information from the readout module 104. A safety module 108 can analyze operation of the detector system 100 and may generate alerts upon detecting one or more faults. In embodiments, the safety module 108 can include active pixel test injection functionality. In embodiments, the safety module 108 can provide Automotive Safety Integrity Level (ASIL) related functionality, as described more fully below. The detector system 100 can include a regulator 110 to provide one or more regulated voltages for the system.

Figure 2A:
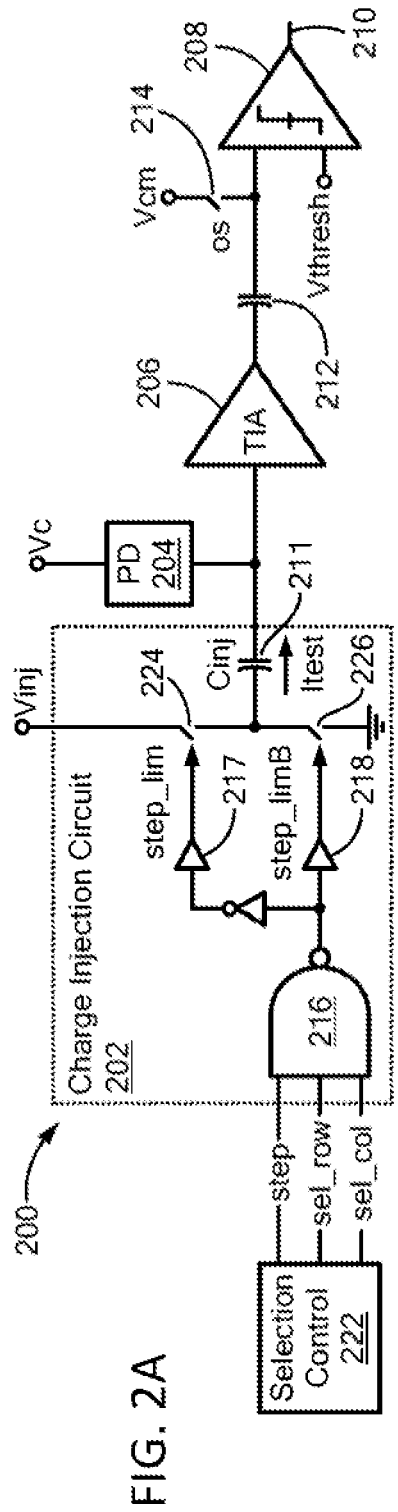
FIG. 2A is a diagram of an example circuit implementation of the system of FIG. 1.

FIG. 2A shows an example detector system 200 having programmable active pixel test injection functionality in accordance with example embodiments of the disclosure. The system 200 can include a charge/pixel test injection circuit 202 for injecting a signal into a photo-detector 204 circuit, which is coupled to the input of an amplifier 206, such as a transimpedance amplifier (TIA). A threshold detector 208, such as a voltage discriminator, can generate an output signal 210 based on the output of the amplifier 206. The TIA 206 converts a current, such as a current pulse from the photo-detector 204 or pixel injection circuit 202, into a corresponding voltage signal. In embodiments, the test injection circuit 202 includes an injection capacitor 211 that is sized to inject a pulse that may be of similar characteristics to a pulse generated by the photodiode 204 in response to received photonic energy from signal return.

In the illustrated embodiment of FIG. 2A, the circuit is implemented as a single-ended circuit with implicit reference to ground or another reference voltage. In the illustrated embodiment of FIG. 3A, a differential circuit implementation is shown which converts the photo-current into a differential output voltage.

The voltage discriminator 208 detects when the amplifier 206 output exceeds a threshold voltage Vthresh. When the threshold voltage Vthresh is exceeded, the voltage discriminator 208 produces a digital output pulse corresponding to a time for a duration of the threshold voltage Vthresh exceedance. In single-ended pixel systems, the threshold is directly applied to the negative input of the voltage discriminator 208. In embodiments, the amplifier 206 output may be coupled to the input of the voltage discriminator 208 though an AC coupling capacitor 212.

In the example embodiment of FIG. 2A, the charge injection circuit 202 is coupled to the amplifier 206 for injecting a pulse from the injection capacitor 211 into the amplifier that may mimic a pulse generated by the photo-detector 204 during normal operation. A selection control module 222 coupled to the charge injection circuit 202 can control the generation and characteristics of test pulses by controlling the state of switches, such as a first switch 224 and a second switch 226 in the illustrated embodiment, and selection signals.

Figure 2B:
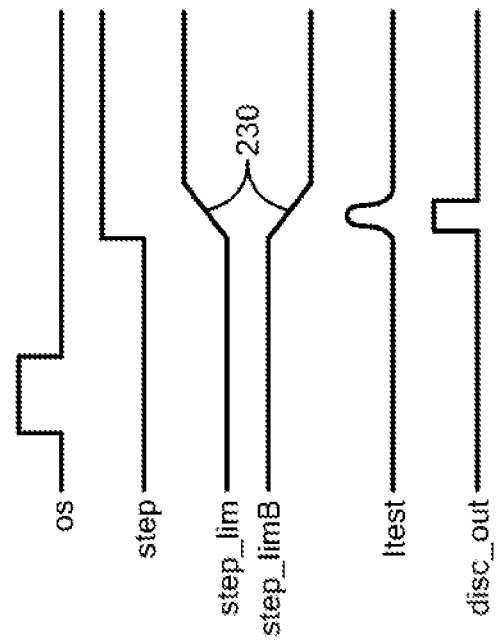
FIG. 2B is a waveform diagram for signals in the circuit of FIG. 2A.

FIG. 2B show example signals for operation of the circuit 200 of FIG. 2A. An os signal pulse can momentarily close a switch 214 coupled to a common mode voltage supply prior to test pulse injection. A step pulse can be input to a logic gate 216. In the illustrated embodiment, the logic gate comprises a NAND gate. A row select sel_row signal and column select sel_col signal corresponding to a particular pixel in an array can also be inputs to the logic gate 216. When the step signal, the row select signal, and the column select signal to the logic gate 216 are active, an output of the logic gate transitions to an active state, shown as LO, which generate a step_lim and step_limB signal, which are of opposite polarity. The step_lim signal controls the state of the first switch 224 and the step_limB signal controls the state of the second switch 226.

The slope 230 of the step_lim signal and the step_limB signal can be controlled to shape the current pulse Itest from the injection capacitor 211. In the illustrated embodiment, the injection capacitor 211 is coupled between the first and second switches 224, 226. The first switch 224 is coupled to an injection voltage signal Vinj and the second switch 226 is coupled to a voltage reference, such as ground. The injection voltage Vinj level may also define the characteristics of the injection pulse Itest. In embodiments, respective buffer elements 217, 218 can define characteristics, such as ramp slope, of the switch control signals step_lim, step_limB to shape the pulse. For example, the drive strength, impedance, capacitance, fabrication technology and the like, can be used to control the switch signals, and therefore, the shape of the injection pulse Itest.

As described above, the injection pulse Itest is amplified by the amplifier 206 and, if above a voltage threshold Vthresh, the voltage discriminator 208 outputs 210 a pulse disc out signal corresponding to the injection pulse Itest.

FIG. 3A shows the system of FIG. 3 in a differential implementation 300. The system 300 includes a charge/pixel test injection circuit 302 for injecting a signal into a photodetector 304 circuit, which is coupled to the input of a differential amplifier 306, such as a transimpedance amplifier (TIA). The photodetector 304, which includes an inherent capacitance 305, is coupled to a first input of the differential amplifier 306 and to the injection capacitor 311. A second input of the amplifier 306 is coupled to a capacitor 307, which is coupled to a voltage supply Vc and also coupled to the anode of the photodiode 304. A differential voltage discriminator 308, can generate an output signal 310 based on the output of the differential amplifier 306.

The differential voltage discriminator 308 detects when the positive input exceeds the negative input and produces a digital output pulse corresponding to time and duration of the positive input exceedance. In the illustrated embodiment, a threshold generator 319 can be coupled to the negative input of the voltage discriminator 308. An alternative embodiment injects a differential threshold though coupled capacitors to both positive and negative inputs of the voltage discriminator 308.

FIG. 3B shows example waveforms for the circuit of FIG. 3A. The waveforms are similar to the waveforms in FIG. 3A so that descriptions are not repeated here.

In embodiments, the system can confirm that the test pulse Itest is seen at the output of the voltage discriminator 208,308. For example, the safety module 108 of FIG. 1 can include circuitry to monitor the output of the voltage discriminator during test operations, such as pulse injection. If safety module 108 does not 'see' the test pulse at the output of the discriminator, an alert can be generated.

It is understood that control logic can comprise a decoder allowing for control of the pixel injection in a number of different ways. In some embodiments, row and column select controls to enable individual pixel selection for active test current injection. Multiple pixels on a row or multiple pixels on a column can be selected, as well as all pixels on a row, all pixels on a column, multiple rows or columns of pixels, or all pixels to be globally selected.

FIG. 4 shows an example selection control module 400 for pixel array row and column selection. An array 402 comprises pixels 404 each of which is connected to a row select signal 406 and a column select signal 408. The selection control module 400 can control the row and column select signals 406, 408 to select a particular pixel 404 in the array. In embodiments, the selection control modules generate the step, sel_row, and sel_col signals of FIG. 2A.

It is understood that selecting pixels for pulse injection can be implemented in a wide variety of configurations in hardware, software, and combinations thereof, to meet the needs of a particular application. It is further understood that one pixel, one row of pixels, one column of pixels, or any practical subset of pixels can be selected for active pixel test injection.

FIG. 5 shows an example sequence of steps for providing photodetection with active pixel test injection. In step 500, one or more pixels within an array can be selected for pixel injection. For example, row and column select signals can be controlled to select a particular pixel. In step 502, switches are closed to generate a pulse of desired width. In step 504, an amplifier amplifies the pulse. In embodiments, amplifier generates a voltage output corresponding to a current level of the pulse. In step 506, a voltage discriminator compares the signal from the amplifier with a threshold voltage. In step 508, the discriminator output transitions to a different state during the time the voltage threshold is exceeded. In step 510, the output signal on the discriminator is checked for proper operation based on the expected response to the test pulse, which may mimic a pulse from a photodetector during normal operation. An alert can be generated if a fault is detected.

Figure 6:
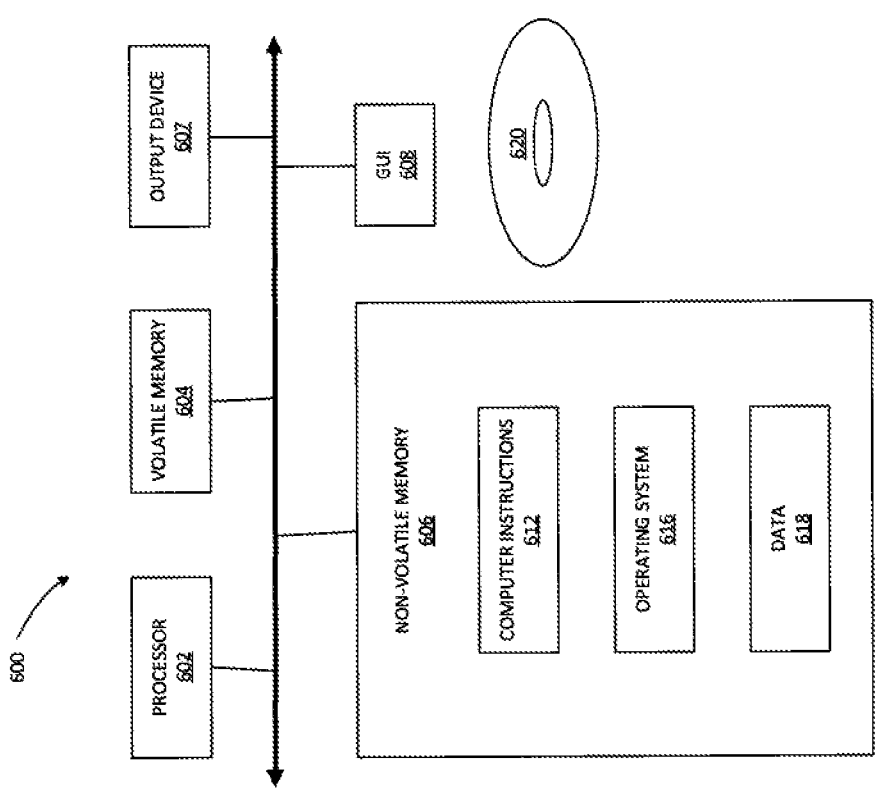
FIG. 6 is a schematic representation of an example computer that can perform at least a portion of the processing described herein.

FIG. 6 shows an exemplary computer 600 that can perform at least part of the processing described herein. For example, the computer 600 can perform processing to implement pixel section and pulse generation. The computer 600 includes a processor 602, a volatile memory 604, a non-volatile memory 606 (e.g., hard disk), an output device 607 and a graphical user interface (GUI) 608 (e.g., a mouse, a keyboard, a display, for example). The non-volatile memory 606 stores computer instructions 612, an operating system 616 and data 618. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general purpose graphical processing units (GPGPU), and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. A detector system, comprising:
a photodetector;
an amplifier having an input to receive an output from the photodetector;
a discriminator to receive an output from the amplifier and generate an active output signal when the output from the amplifier is greater than a threshold; and
an injection circuit coupled to the input of the amplifier, wherein the injection circuit is configured to selectively inject a test pulse that mimics a pulse from the photodetector for verifying operation of the detector system, wherein the injection circuit comprises:
an injection capacitor coupled to the input of the amplifier, wherein the injection capacitor is sized to mimic the pulse from the photodetector, wherein the amplifier comprises a transimpedance amplifier to convert an input voltage to an output current;
a logic gate to receive a step signal and pixel row and column signals for the photodetector within an array and output a step lim signal;
an inverter coupled to the output of the logic gate to generate an inverted step lim signal;
a first switch controlled by the step lim signal, wherein the first switch is coupled between a voltage injection signal and the injection capacitor;
a second switch controlled by the inverted step lim signal, wherein the second switch is coupled between the injection capacitor and a voltage reference,
wherein the step-lim signal and the inverted step lim signal are rate-limited to control a width of the test pulse and to control slope to shape an output from the injection capacitor.

2. The system according to claim 1, wherein the discriminator comprises a voltage discriminator.

3. The system according to claim 1, wherein the amplifier and the discriminator receive differential signals so that that discriminator detects when a positive input to the discriminator exceeds a negative input to the discriminator.

4. The system according to claim 1, further including a safety module to detect a fault by monitoring an output of the discriminator.

5. The system according to claim 4, wherein the safety module is configured to generate an alert after detection of the fault.

6. A method, comprising:
amplifying, with an amplifier, an input from an output from a photodetector;
generating, by a discriminator, an active output signal when the output from the amplifier is greater than a threshold; and
selectively injecting, by an injection circuit, a test pulse that mimics a pulse from the photodetector for verifying operation of the detector system,
wherein the injection circuit comprises:
an injection capacitor coupled to the input of the amplifier, wherein the injection capacitor is sized to mimic the pulse from the photodetector, wherein the amplifier comprises a transimpedance amplifier to convert an input voltage to an output current;
a logic gate to receive a step signal and pixel row and column signals for the photodetector within an array and output a step lim signal;
an inverter coupled to the output of the logic gate to generate an inverted step lim signal;
a first switch controlled by the first step lim signal, wherein the first switch is coupled between a voltage injection signal and the injection capacitor;
a second switch controlled by the inverted step lim signal, wherein the second switch is coupled between the injection capacitor and a voltage reference,
wherein the step lim signal and the inverted step lim signal are rate-limited to control a width of the test pulse and to control slope to shape an output from the injection capacitor.

7. The method according to claim 6, wherein the discriminator comprises a voltage discriminator.

8. The method according to claim 6, wherein the amplifier and the discriminator receive differential signals so that that discriminator detects when a positive input to the discriminator exceeds a negative input to the discriminator.

9. The method according to claim 6, further including a safety module to detect a fault by monitoring an output of the discriminator.

10. The method according to claim 9, wherein the safety module is configured to generate an alert after detection of the fault.

\* \* \* \* \*